(12) United States Patent
Huang et al.

(10) Patent No.: US 7,446,307 B2
(45) Date of Patent: Nov. 4, 2008

(54) SENSOR SEMICONDUCTOR DEVICE AND FABRICATION METHOD OF THE SENSOR SEMICONDUCTOR DEVICE

(75) Inventors: Chien-Ping Huang, Hsinchu Hsein (TW); Chih-Ming Huang, Hsinchu Hsein (TW); Cheng-Yi Chang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 201 days.

(21) Appl. No.: 11/373,723

(22) Filed: Mar. 10, 2006

(65) Prior Publication Data
US 2007/0018088 A1 Jan. 25, 2007

(30) Foreign Application Priority Data
Jul. 21, 2005 (TW) .............................. 94124645 A

(51) Int. Cl.
*H01J 5/02* (2006.01)
*H01L 23/48* (2006.01)
(52) U.S. Cl. ....................................... 250/239; 257/786
(58) Field of Classification Search ................. 250/239; 438/64–67, 74, 98; 257/431–434, 448, 457, 257/678, 680, 686, 687, 777, 786
See application file for complete search history.

(56) References Cited

U.S. PATENT DOCUMENTS

| 6,774,499 | B1 * | 8/2004 | Yang ........................... 257/786 |
| 7,102,239 | B2 * | 9/2006 | Pu et al. ...................... 257/778 |
| 2003/0071338 | A1 * | 4/2003 | Jeung et al. .................. 257/678 |
| 2005/0103987 | A1 * | 5/2005 | Brechignac et al. .......... 250/226 |

FOREIGN PATENT DOCUMENTS

JP 06112249 A * 4/1994

* cited by examiner

*Primary Examiner*—Thanh X Luu
(74) *Attorney, Agent, or Firm*—Peter F. Corless; Steven M. Jensen; Edwards Angell Palmer & Dodge LLP

(57) ABSTRACT

A sensor semiconductor device and a fabrication method thereof are provided. The fabrication method includes mounting a sensor chip on a surface of a substrate; forming a transparent cover on the sensor chip; forming a dielectric layer and a circuit layer on the substrate, wherein the sensor chip is electrically connected to the substrate through the circuit layer and the transparent cover is exposed from the dielectric layer such that light can pass through the transparent cover to reach a sensor region of the sensor chip and allow the sensor chip to operate; and implanting a plurality of solder balls on another surface of the substrate to electrically connect the sensor chip to an external device. The sensor semiconductor device can be cost-effectively fabricated, and the circuit cracking and known good die (KGD) problems of the prior art can be avoided.

14 Claims, 7 Drawing Sheets

SENSOR SEMICONDUCTOR DEVICE AND FABRICATION METHOD OF THE SENSOR SEMICONDUCTOR DEVICE

FIELD OF THE INVENTION

The present invention relates to sensor semiconductor devices and fabrication methods thereof, and more particularly, to a CSP (chip scale package) sensor semiconductor device and a method for fabricating the semiconductor device.

BACKGROUND OF THE INVENTION

Conventional image sensor package includes a sensor chip mounted on a chip carrier and electrically connected to the chip carrier via bonding wires, and a transparent cover for covering the sensor chip to allow light to be captured by the sensor chip through the transparent cover. The image sensor package can be used in various electronic devices such as digital still camera (DSC), digital video camera (DV), optical mouse, mobile phone, fingerprint recognizer and the like.

In order to effectively reduce the size of the image sensor package, the CSP (chip scale package) technology is employed to form a CSP sensor semiconductor device, which desirably has a size slightly larger than the sensor chip incorporated therein and is suitably applied to a miniaturized electronic device.

FIG. 1 shows a CSP sensor semiconductor device disclosed in U.S. Pat. No. 6,646,289. For fabricating the CSP sensor semiconductor device, an active surface of a sensor chip 11 during a wafer stage is covered with a glass member 12 for protecting a sensor region 18 of the sensor chip 11, and a non-active surface of the sensor chip 11 is applied with an epoxy layer 13 and a passivation layer 14 thereon. Then, an etching process is performed on the non-active surface of the sensor chip 11 to form a plurality of inclined openings 15 for exposing electrode pads 110 of the sensor chip 11. A patterned circuit layer 16 can subsequently be formed on sidewalls of the inclined openings 15 and is electrically connected to the electrode pads 10 of the sensor chip 11. A plurality of solder balls 17 are implanted on the circuit layer 16 and a singulation process is performed so as to complete the CSP sensor semiconductor device, such that the semiconductor device can be electrically connected to an external device via the solder balls 17.

However, in the foregoing semiconductor device, a contact position between the circuit layer on the sidewall of the inclined opening and the electrode pad of the sensor chip forms an acute angle, making stress easily concentrated on the contact position and thereby leading to circuit cracking and failure in electrical connection. Moreover, the semiconductor device is fabricated in the wafer stage, such that fabrication processes are complicated and the problem of known good die (KGD) cannot be effectively solved, thereby resulting in a great increase in the fabrication cost.

Therefore, the problem to be solved here is to provide a CSP sensor semiconductor device and a fabrication method thereof such that the semiconductor device can be cost-effectively fabricated and circuit cracking can be avoided.

SUMMARY OF THE INVENTION

In light of the foregoing drawbacks in the prior art, a primary objective of the present invention is to provide a low-cost sensor semiconductor device and a fabrication method thereof.

Another objective of the present invention is to provide a sensor semiconductor device and a fabrication method thereof, for preventing circuit cracking.

A further objective of the invention is to provide a CSP sensor semiconductor device and a fabrication method thereof.

In order to achieve the foregoing and other objectives, the present invention proposes a fabrication method of a sensor semiconductor device, comprising the steps of: mounting at least one sensor chip on a first surface of a substrate, with a plurality of electrical contacts being formed on the first surface of the substrate, wherein an active surface of the sensor chip is formed with a sensor region and a plurality of electrode pads thereon, and a non-active surface of the sensor chip is attached to the substrate; forming a transparent cover on the sensor region of the sensor chip; applying a dielectric layer on the substrate and the sensor chip, wherein the dielectric layer is formed with a plurality of openings for exposing the electrode pads of the sensor chip and the electrical contacts of the substrate, and the transparent cover is not covered by the dielectric layer; and forming a circuit layer on the dielectric layer, wherein the circuit layer is electrically connected to the electrical contacts of the substrate and the electrode pads of the sensor chip. The fabrication method further comprises: applying a protective layer on the circuit layer, with the transparent cover being exposed from the protective layer; and mounting a plurality of solder balls on a second surface of the substrate opposed to the first surface of the substrate. Further, the fabrication method of the present invention can be carried out in a batch-type manner or for a single semiconductor device. By the batch-type fabrication method, a singulation process is further performed to form a plurality of sensor semiconductor devices. The electrical contacts formed on the substrate can be connection pads or metallic bumps.

The present invention also proposes a sensor semiconductor device comprising: a substrate having a first surface and an opposed second surface, with a plurality of electrical contacts being formed on the first surface; a sensor chip mounted on the first surface of the substrate, wherein an active surface of the sensor chip is formed with a sensor region and a plurality of electrode pads thereon, and a non-active surface of the sensor chip is attached to the substrate; a transparent cover formed on the sensor region of the sensor chip; a dielectric layer applied on the substrate and the sensor chip, wherein the dielectric layer is formed with a plurality of openings for exposing the electrical contacts of the substrate and the electrode pads of the sensor chip, and the transparent cover is not covered by the dielectric layer; and a circuit layer formed on the dielectric layer and electrically connected to the electrical contacts of the substrate and the electrode pads of the sensor chip. The sensor semiconductor device further comprises: a protective layer applied on the circuit layer, with the transparent cover being exposed from the protective layer; and a plurality of solder balls mounted on the second surface of the substrate. The electrical contacts formed on the substrate can be connection pads or metallic bumps.

Therefore, by the sensor semiconductor device and the fabrication method thereof in the present invention, the sensor chip is firstly mounted on the substrate, and the sensor region of the sensor chip is covered with the transparent cover, and then the dielectric layer and the circuit layer are formed, wherein the circuit layer is electronically connected to the substrate and the sensor chip, and the transparent cover is exposed from the dielectric layer, such that external light can pass through the transparent cover to reach the sensor chip and allow the sensor chip to operate. Further, the sensor chip is electrically connected to the substrate through the circuit layer and can further be electrically connected to an external device via the solder balls mounted on the second surface of the substrate. In the present invention, the sensor chip can be tested and confirmed having normal functionality prior to being attached to the substrate, that is, only a sensor chip successfully passing the test is to be mounted on the substrate, such that the reliability of subsequent fabrication processes is improved and the known good die problem of the prior art can be solved. As the sensor chip is electrically connected to the substrate through the circuit layer and further electrically connected to the external device via the solder balls formed on the substrate, the circuit cracking problem of the prior art due to stress concentration can be avoided. Thus, the sensor semiconductor device of the present invention is cost-effectively fabricated.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a sensor semiconductor device and a fabrication method thereof proposed in the present invention are described as follows with reference to FIGS. 2 to 6. It should be noted that the drawings are simplified schematic diagrams only showing components relating to the present invention, and the arrangement of components could be more complex in practice.

FIGS. 2A-2F show the steps of a fabrication method of a sensor semiconductor device according to a first preferred embodiment of the present invention. The following description relates to a batch-type fabrication method. It should be understood that the sensor semiconductor device of the present invention can also be fabricated in a single-type manner under appropriate fabrication conditions.

Figure 1:
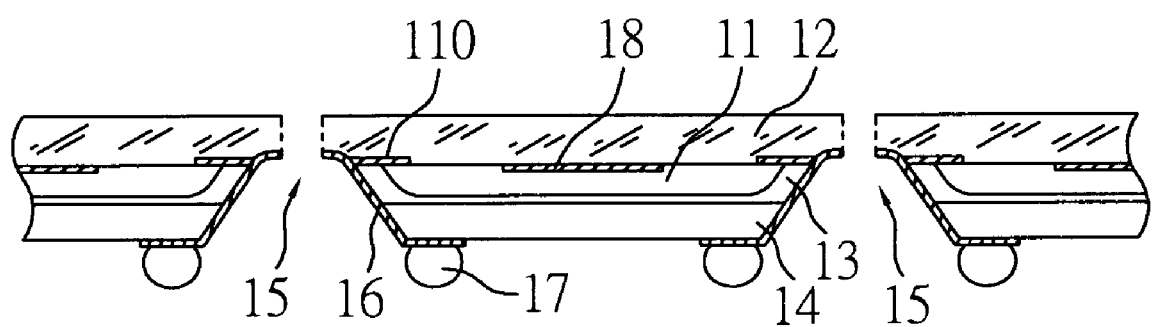
FIG. 1 (PRIROR ART) is a cross-sectional view of a CSP sensor semiconductor device disclosed in U.S. Pat. No. 6,646,289.
Figure 2A:
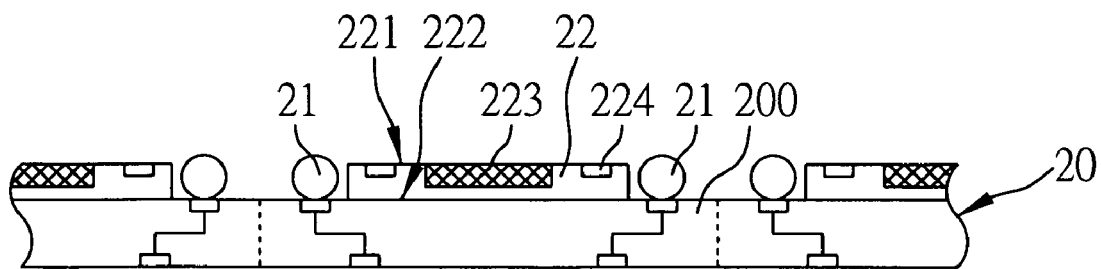
FIGS. 2A-2F are schematic cross-sectional diagrams showing steps of a fabrication method of a sensor semiconductor device in accordance with a first preferred embodiment of the present invention.

As shown in FIG. 2A, a substrate module plate 20 comprising a plurality of substrates 200 is provided, wherein each of the substrates 200 has a first surface and an opposed second surface, and a plurality of electrical contacts such as metallic bumps 21 are formed on the first surface of each of the substrates 200 and electrically connected to the corresponding substrate 200. At least one sensor chip 22 is mounted on the first surface of each of the substrates 200. The plurality of substrates 200 of the substrate module plate 20 can be arranged in an array or in a row. The metallic bumps 21 can be made of gold or solder. The sensor chip 22 has an active surface 221 and an opposed non-active surface 222, wherein a sensor region 223 and a plurality of electrode pads 224 are formed on the active surface 221 of the sensor chip 22, and the non-active surface 222 of the sensor chip 22 is attached to the corresponding substrate 200. Further, a thinning process can be performed on the non-active surface 222 of the sensor chip 22, and the sensor chip 22 can be tested and confirmed as a good die with normal functionality before being attached to the substrate 200.

Figure 2B:
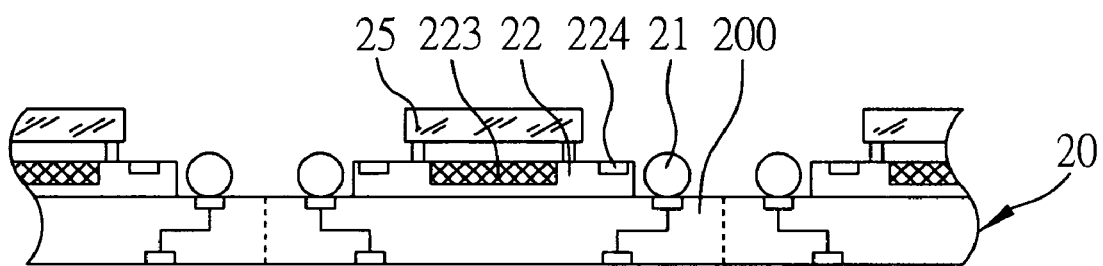

As shown in FIG. 2B, a transparent cover 25 is formed to cover the sensor region 223 of the sensor chip 22 on each of the substrates 200. The transparent cover 25 can be made of glass or a transparent adhesive.

Figure 2C:
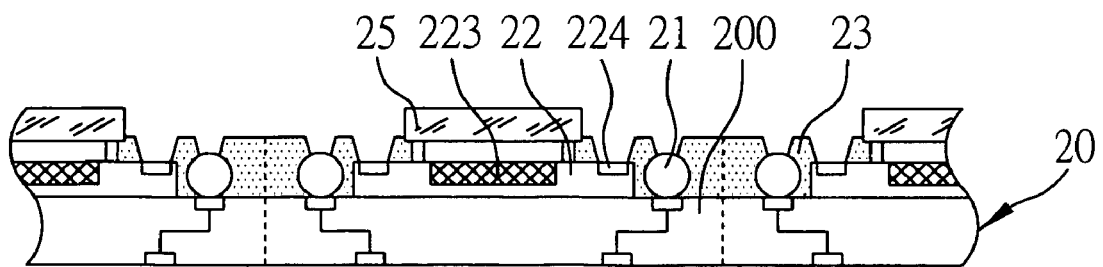

As shown in FIG. 2C, a dielectric layer 23 is applied on the substrate module plate and covers the substrates 200, the metallic bumps 21 and the sensor chips 22. The dielectric layer 23 is formed with a plurality of openings 230 for exposing the metallic bumps 21 and the electrode pads 224 of the sensor chips 22, and the transparent covers are not covered by the dielectric layer 23.

Figure 2D:
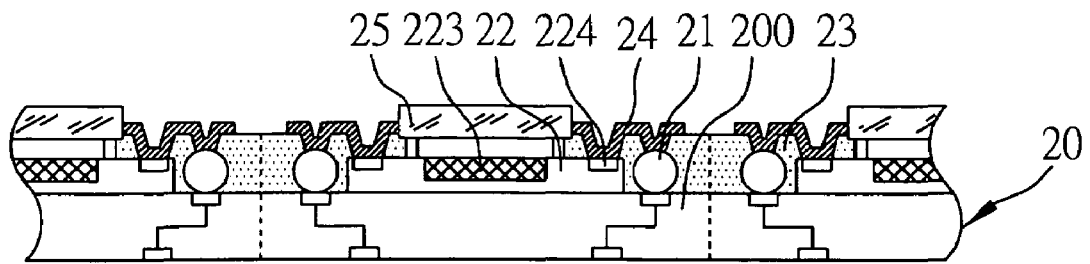

As shown in FIG. 2D, a circuit layer 24 is formed on the dielectric layer 23 and is electrically connected to the metallic bumps 21 and the electrode pads 224 of the sensor chips 22.

Figure 2E:
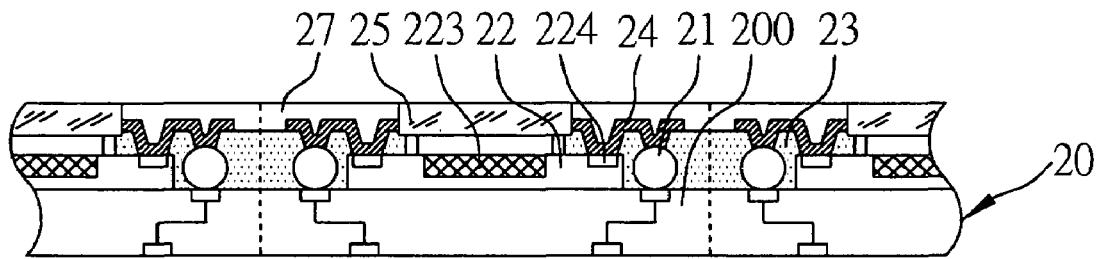

As shown in FIG. 2E, a protective layer 27 is applied on the circuit layer 24, allowing the transparent covers 25 to be exposed from the protective layer 27. The protective layer 27 can be a solder mask layer.

Figure 2F:
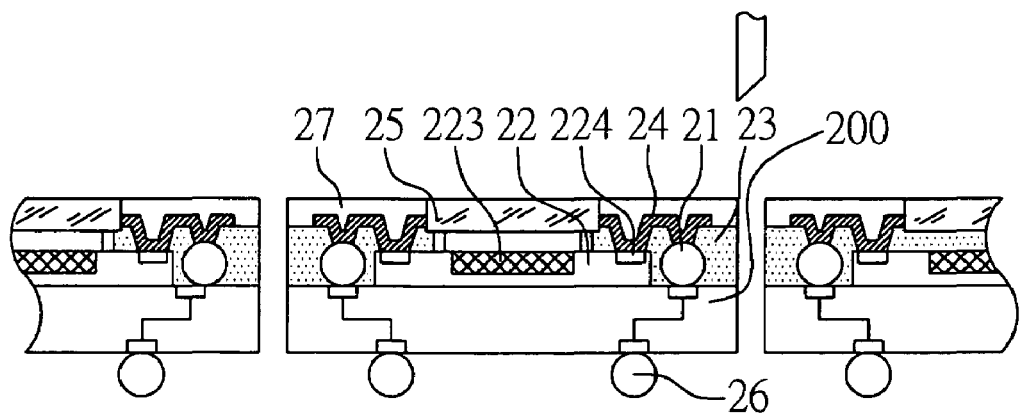

As shown in FIG. 2F, a plurality of solder balls 26 are implanted on the second surface of each of the substrates 200, and a singulation process is performed so as to form a plurality of sensor semiconductor devices. As such, the sensor chip of the sensor semiconductor device can be electrically connected to an external device via the electrode pads, the circuit layer, the metallic bumps, conductive structures in the substrate and the solder balls.

By the foregoing fabrication method, a sensor semiconductor device is provided in the present invention, comprising: a substrate 200 having a first surface and an opposed second surface, with a plurality of electrical contacts such as metallic bumps 21 being formed on the first surface of the substrate 200; a sensor chip 22 mounted on the first surface of the substrate 200, wherein an active surface 221 of the sensor chip 22 is formed with a sensor region 223 and a plurality of electrode pads 224 thereon, and a non-active surface 222 of the sensor chip 22 is attached to the substrate 200; a transparent cover 25 formed on the sensor region 223 of the sensor chip 22; a dielectric layer 23 applied on the substrate 200 and the sensor chip 22, wherein the dielectric layer 23 is formed with a plurality of openings 230 for exposing the metallic bumps 21 and the electrode pads 224 of the sensor chip 22, and the transparent cover 25 is not covered by the dielectric layer 23; and a circuit layer 24 formed on the dielectric layer 23 and electrically connected to the metallic bumps 21 and the electrode pads 224 of the sensor chip 22. The sensor semiconductor device further comprises a protective layer 27 applied on the circuit layer 24, with the transparent cover 25 being exposed from the protective layer 27; and a plurality of solder balls 26 mounted on the second surface of the substrate 200.

Therefore, by the sensor semiconductor device and the fabrication method thereof in the present invention, the sensor chip is firstly mounted on the substrate, and the sensor region of the sensor chip is covered with the transparent cover, and then the dielectric layer and the circuit layer are formed, wherein the circuit layer is electronically connected to the substrate and the sensor chip, and the transparent cover is exposed from the dielectric layer, such that external light can pass through the transparent cover to reach the sensor chip and allow the sensor chip to operate. Further, the sensor chip is electrically connected to the substrate through the circuit layer and can further be electrically connected to an external device via the solder balls mounted on the second surface of the substrate. In the present invention, the sensor chip can be tested and confirmed having normal functionality prior to being attached to the substrate, that is, only a sensor chip successfully passing the test is to be mounted on the substrate, such that the reliability of subsequent fabrication processes is improved and the known good die problem of the prior art can be solved. As the sensor chip is electrically connected to the substrate through the circuit layer and further electrically connected to the external device via the solder balls formed on the substrate, the circuit cracking problem of the prior art due to stress concentration can be avoided. Thus, the sensor semiconductor device of the present invention is cost-effectively fabricated.

Figure 3:
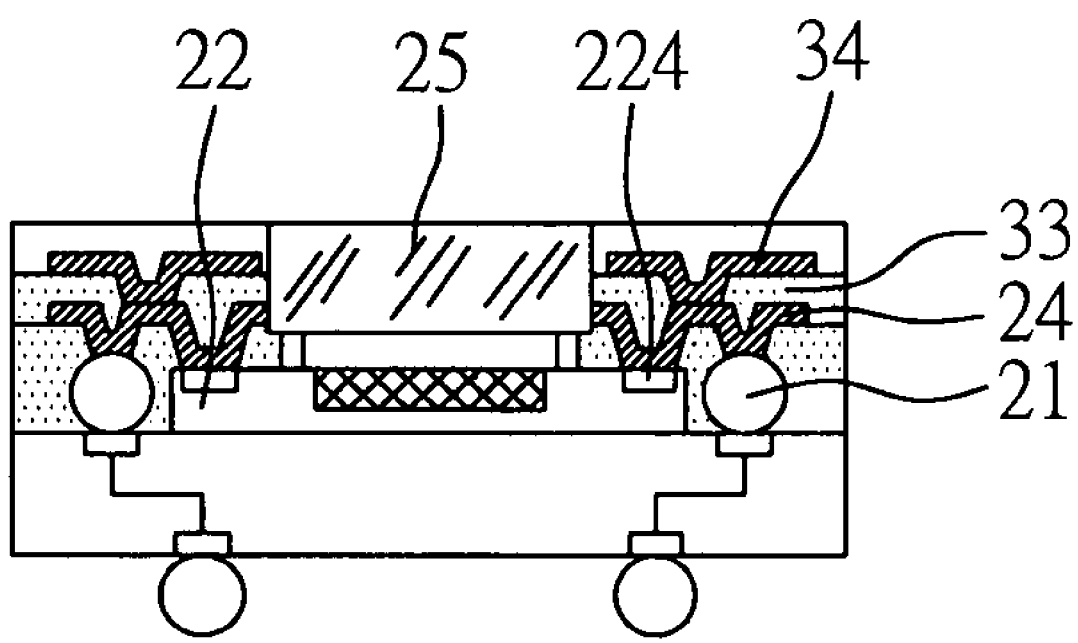
FIG. 3 is a cross-sectional view of a sensor semiconductor device in accordance with a second preferred embodiment of the present invention.

FIG. 3 shows a sensor semiconductor device according to a second preferred embodiment of the present invention. The sensor semiconductor device of the second embodiment is fabricated by a method similar to that described in the above first embodiment, with a primary difference in that as shown in FIG. 3, a circuit build-up process is performed on the circuit layer 24 that is electrically connected to the electrode pads 224 of the sensor chip 22 and the metallic bumps 21 on the substrate 200. The circuit build-up process comprises the following steps. Firstly, a dielectric layer 33 is applied on the circuit layer 24 and is formed with openings for exposing portions of the circuit layer 24. The transparent cover 25 is not covered by the dielectric layer 33. Then, another circuit layer 34 is formed on the dielectric layer 33 and is electrically connected to the circuit layer 24 underneath the dielectric layer 33 through the openings of the dielectric layer 33, such that a circuit build-up structure is fabricated and can improve the electrical performance of the semiconductor device. It should be noted that the number of the circuit build-up layer is not limited to that shown in the drawing and can be flexibly adjusted according to the practical requirement.

FIGS. 4A-4E show the steps of a fabrication method of a sensor semiconductor device according to a third preferred embodiment of the present invention.

Figure 4A:
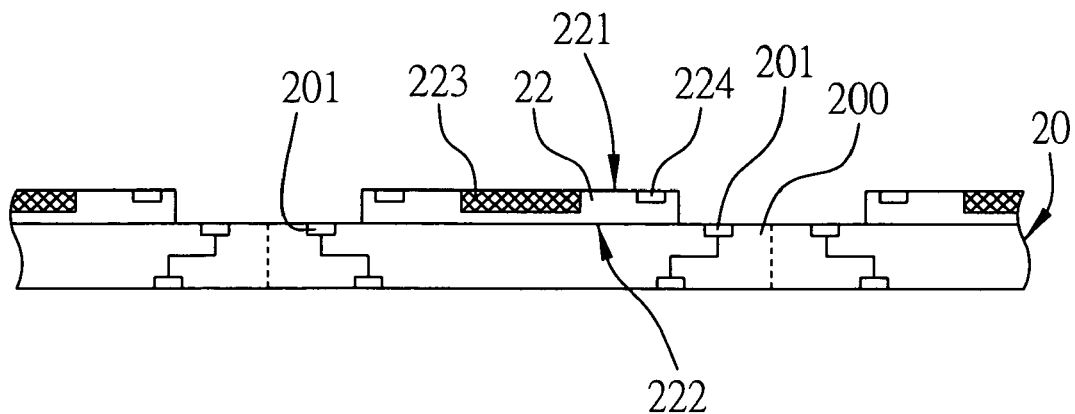
FIGS. 4A-4E are schematic cross-sectional diagrams showing steps of a fabrication method of a sensor semiconductor device in accordance with a third preferred embodiment of the present invention.

As shown in FIG. 4A, a substrate module plate 20 comprising a plurality of substrates 200 is provided, wherein each of the substrates 200 has a first surface and an opposed second surface, and a plurality of electrical contacts such as connection pads 201 are formed on the first surface of each of the substrates 200. The plurality of substrates 200 can be arranged in an array or in a row. At least one sensor chip 22 is mounted on the first surface of each of the substrates 200. The sensor chip 22 has an active surface 221 and an opposed non-active surface 222, wherein the active surface 221 of the sensor chip 22 is formed with a sensor region 223 and a plurality of electrode pads 224 thereon, and the non-active surface 222 of the sensor chip 22 is attached to the corresponding substrate 200. Further, a thinning process can be performed on the non-active surface 222 of the sensor chip 22, and the sensor chip 22 can be tested and confirmed as a good die with normal functionality before being attached to the substrate 200.

Figure 4B:
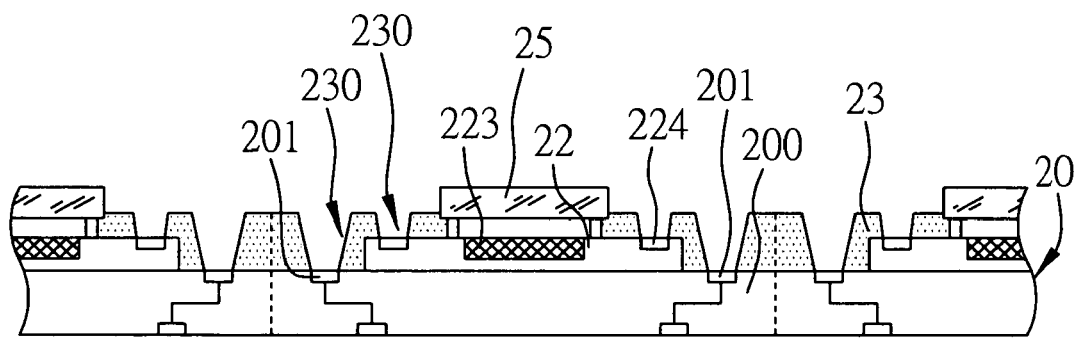

As shown in FIG. 4B, a transparent cover 25 is formed to cover the sensor region 223 of the sensor chip 22 on each of the substrates 200. The transparent cover 25 can be made of glass or a transparent adhesive. A dielectric layer 23 is applied on the substrate module plate 20 to cover the substrates 200 and the sensor chips 22, wherein the dielectric layer 23 is formed with openings 230 for exposing the connections pads 201 of the substrates 200 and the electrode pads 224 of the sensor chips 22, and the transparent covers 25 are not covered by the dielectric layer 23.

Figure 4C:
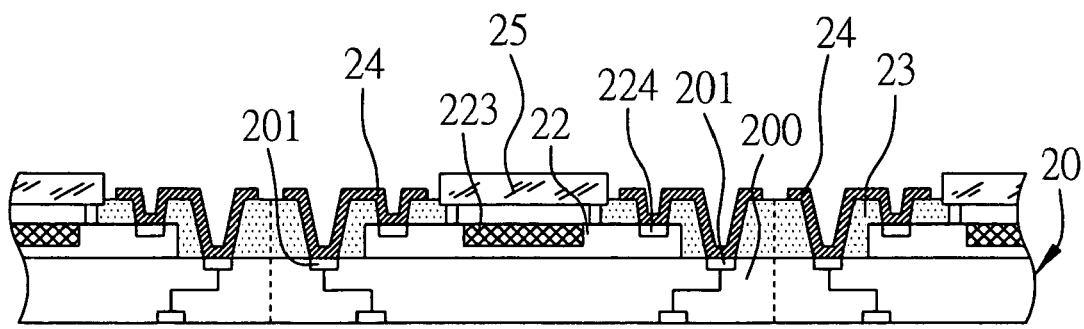

As shown in FIG. 4C, a circuit layer 24 is formed on the dielectric layer 23 and is electrically connected to the connection pads 201 of the substrates 200 and the electrode pads 224 of the sensor chips 22.

Figure 4D:
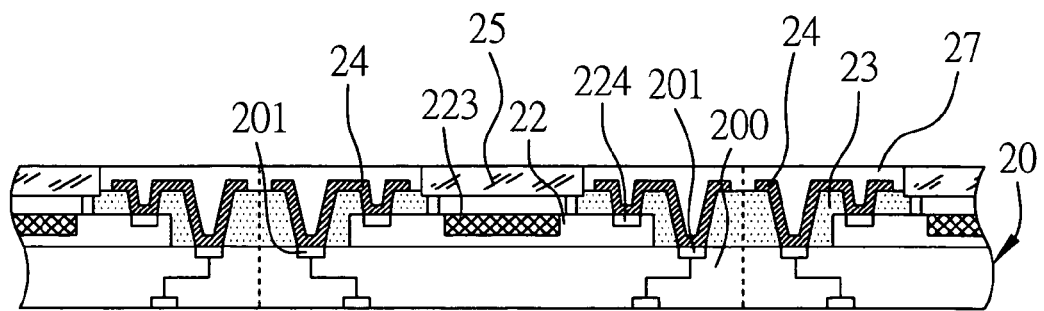

As shown in FIG. 4D, a protective layer 27 is formed on the circuit layer 24, allowing the transparent covers 25 to be exposed from the protective layer 27. The protective layer 27 can be a solder mask layer.

Figure 4E:
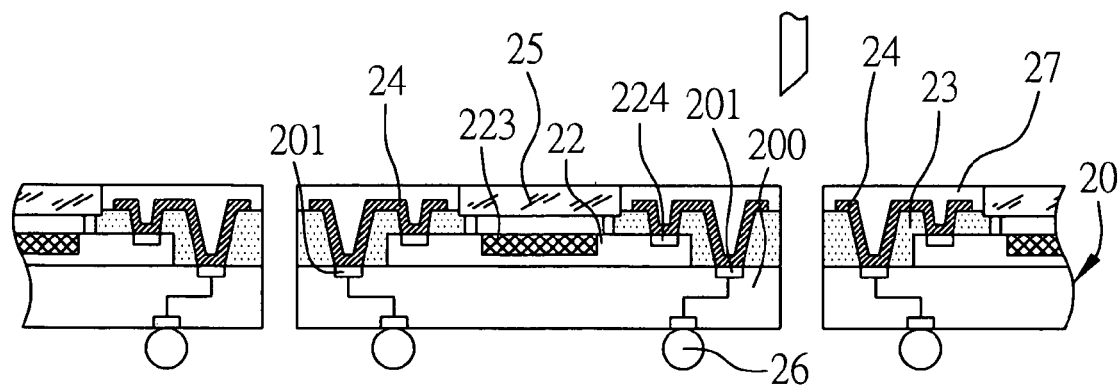

As shown in FIG. 4E, a plurality of solder balls 26 are implanted on the second surface of each of the substrates 200, and a singulation process is performed so as to form a plurality of sensor semiconductor devices. As such, the sensor chip of the sensor semiconductor device can be electrically connected to an external device via the electrode pads, the circuit layer, the connection pads, conductive structures in the substrate and the solder balls.

Figure 5:
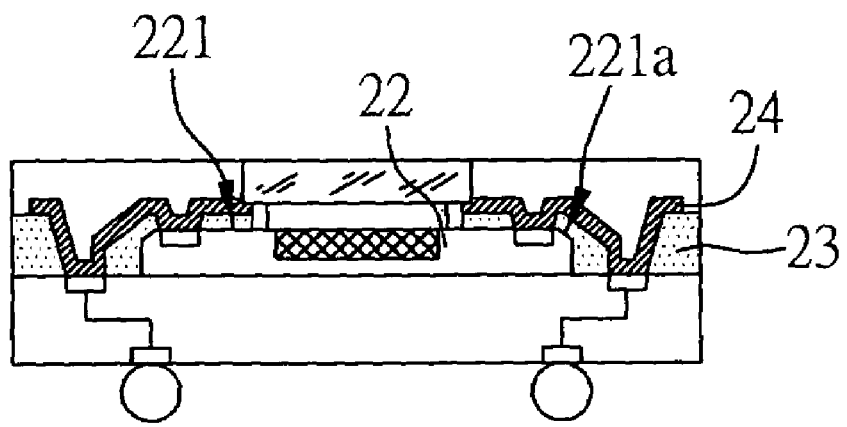
FIG. 5 is a cross-sectional view of a sensor semiconductor device in accordance with a fourth preferred embodiment of the present invention.

FIG. 5 shows a sensor semiconductor device according to a fourth preferred embodiment of the present invention. The sensor semiconductor device of the fourth embodiment is similar to that of the above third embodiment, with a primary difference in that as shown in FIG. 5, the sensor chip 22 can be in advance cut at edge of the active surface 221 thereof, that is, a corner portion of the sensor chip 22 corresponding to the edge of the active surface 221 is removed, such that a chamfer 221a is formed at the edge of the active surface 221 of the sensor chip 22 and can alleviate stress concentration at the edge of the active surface 221 of the sensor chip 22 during subsequent formation of the dielectric layer 23 and the circuit layer 24, thereby avoiding circuit cracking.

Figure 6:
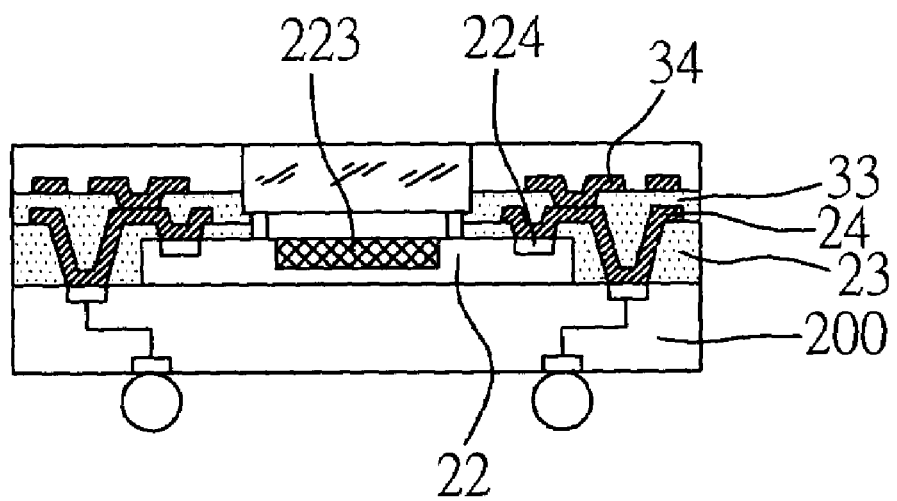
FIG. 6 is a cross-sectional view of a sensor semiconductor device in accordance with a fifth preferred embodiment of the present invention.

FIG. 6 shows a sensor semiconductor device according to a fifth preferred embodiment of the present invention. The sensor semiconductor device of the fifth embodiment is fabricated by a method similar to that described in the foregoing third embodiment, with a primary difference in that as shown in FIG. 6, a circuit build-up process is performed on the circuit layer 24 that is electrically connected to the electrode pads 224 of the sensor chip 22 and the connection pads 201 of the substrate 200. The circuit build-up process comprises the following steps. Firstly, a dielectric layer 33 is applied on the circuit layer 24 and is formed with openings for exposing portions of the circuit layer 24. The transparent cover 25 is not covered by the dielectric layer 33. Then, another circuit layer 34 is formed on the dielectric layer 33 and is electrically connected to the circuit layer 24 underneath the dielectric layer 33 through the openings of the dielectric layer 33, such that a circuit build-up structure is fabricated. As such, external light can pass through the transparent cover 25 to reach the sensor region 223 of the sensor chip 22, and the circuit build-up structure can improve the electrical performance of the semiconductor device. It should be noted that the number of the circuit build-up layer is not limited to that shown in the drawing and can be flexibly adjusted according to the practical requirement.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fabrication method of a sensor semiconductor device, comprising the steps of:
   mounting at least one sensor chip on a surface of at least one substrate, the sensor chip having an active surface and an opposed non-active surface, with the non-active surface of the sensor chip being attached to the substrate, wherein a plurality of electrical contacts are formed on the surface of the substrate, and a sensor region and a plurality of electrode pads are formed on the active surface of the sensor chip, and wherein an edge of the active surface of the sensor chip is formed with a chamfer;
   forming a transparent cover on the sensor region of the sensor chip;
   applying a dielectric layer on the substrate and the sensor chip, wherein the electrical contacts of the substrate, the electrode pads of the sensor chip and the transparent cover are exposed from the dielectric layer;
   forming a circuit layer on the dielectric layer, wherein the circuit layer is electrically connected to the electrical contacts of the substrate and the electrode pads of the sensor chip; and
   applying a protective layer on the circuit layer, with the transparent cover being exposed from the protective layer, wherein the protective layer is a solder mask layer.

2. The fabrication method of claim 1, further comprising a step of mounting a plurality of solder balls on another surface of the substrate.

3. The fabrication method of claim 1, further comprising a step of performing a circuit build-up process on the circuit layer that is electrically connected to the sensor chip and the substrate.

4. The fabrication method of claim 1, wherein the at least one substrate comprises one of a single substrate, a plurality of substrates arranged in an array, and a plurality of substrates arranged in a row.

5. The fabrication method of claim 1, wherein the electrical contacts of the substrate are selected from the group consisting of connection pads and metallic bumps.

6. The fabrication method of claim 5, wherein the metallic bumps are selected from the group consisting of gold bumps and solder bumps.

7. The fabrication method of claim 1, wherein the transparent cover is made of one of glass and a transparent adhesive.

8. A sensor semiconductor device comprising:
   at least one substrate formed with a plurality of electrical contacts on a surface thereof;
   at least one sensor chip having an active surface and an opposed non-active surface,
   wherein the active surface of the sensor chip is formed with a sensor region and a plurality of electrode pads thereon, and the non-active surface of the sensor chip is mounted on the surface of the substrate, and wherein an edge of the active surface of the sensor chip is formed with a chamfer;
   a transparent cover formed on the sensor region of the sensor chip;
   a dielectric layer applied on the substrate and the sensor chip, wherein the electrical contacts of the substrate, the electrode pads of the sensor chip and the transparent cover are exposed from the dielectric layer;
   a circuit layer formed on the dielectric layer and electrically connected to the electrical contacts of the substrate and the electrode pads of the sensor chip; and
   a protective layer applied on the circuit layer, with the transparent cover being exposed from the protective layer, wherein the protective layer is a solder mask layer.

9. The sensor semiconductor device of claim 8, further comprising a plurality of solder balls mounted on another surface of the substrate.

10. The sensor semiconductor device of claim 8, further comprising a circuit build-up structure formed on the circuit layer that is electrically connected to the sensor chip and the substrate.

11. The sensor semiconductor device of claim 8, wherein the at least one substrate comprises one of a single substrate, a plurality of substrates arranged in an array, and a plurality of substrates arranged in a row.

12. The sensor semiconductor device of claim 8, wherein the electrical contacts of the substrate are selected from the group consisting of connection pads and metallic bumps.

13. The sensor semiconductor device of claim 12, wherein the metallic bumps are selected from the group consisting of gold bumps and solder bumps.

14. The sensor semiconductor device of claim 8, wherein the transparent cover is made of one of glass and a transparent adhesive.

* * * * *